(12) United States Patent
Singha Roy et al.

(10) Patent No.: US 11,817,320 B2
(45) Date of Patent: Nov. 14, 2023

(54) CVD BASED OXIDE-METAL MULTI STRUCTURE FOR 3D NAND MEMORY DEVICES

(71) Applicant: Applied Materials, Inc., Santa Clara, CA (US)

(72) Inventors: Susmit Singha Roy, Mountain View, CA (US); Kelvin Chan, San Ramon, CA (US); Hien Minh Le, San Jose, CA (US); Sanjay Kamath, Fremont, CA (US); Abhijit Basu Mallick, Fremont, CA (US); Srinivas Gandikota, Santa Clara, CA (US); Karthik Janakiraman, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 794 days.

(21) Appl. No.: 16/554,834

(22) Filed: Aug. 29, 2019

(65) Prior Publication Data

US 2019/0393042 A1 Dec. 26, 2019

Related U.S. Application Data

(62) Division of application No. 15/633,366, filed on Jun. 26, 2017, now Pat. No. 10,410,869.

(Continued)

(51) Int. Cl.
*C23C 16/50* (2006.01)
*H01L 21/285* (2006.01)
(Continued)

(52) U.S. Cl.
CPC .... *H01L 21/28506* (2013.01); *C23C 16/0272* (2013.01); *C23C 16/06* (2013.01);
(Continued)

(58) Field of Classification Search
CPC ................................................. C23C 16/402
See application file for complete search history.

(56) References Cited

U.S. PATENT DOCUMENTS

2004/0142557 A1\* 7/2004 Levy .................. C23C 16/0272
257/E21.171
2006/0032442 A1 2/2006 Hasebe
(Continued)

FOREIGN PATENT DOCUMENTS

CN 102534615 A 7/2012
EP 3051001 A2 \* 8/2016 ........... C01B 21/087
(Continued)

OTHER PUBLICATIONS

PCT Notification of Transmittal of the International Search Report and the Written Opinion of the International Searching Authority for International Application No. PCT/US2017/039317; dated Sep. 15, 2017; 11 total pages.
(Continued)

*Primary Examiner* — David P Turocy
(74) *Attorney, Agent, or Firm* — Patterson + Sheridan, LLP

(57) ABSTRACT

Implementations described herein generally relate to a method for forming a metal layer and to a method for forming an oxide layer on the metal layer. In one implementation, the metal layer is formed on a seed layer, and the seed layer helps the metal in the metal layer nucleate with small grain size without affecting the conductivity of the metal layer. The metal layer may be formed using plasma enhanced chemical vapor deposition (PECVD) and nitrogen gas may be flowed into the processing chamber along with the precursor gases. In another implementation, a barrier layer is formed on the metal layer in order to prevent the metal layer from being oxidized during subsequent oxide layer deposition process. In another implementation, the
(Continued)

metal layer is treated prior to the deposition of the oxide layer in order to prevent the metal layer from being oxidized.

20 Claims, 10 Drawing Sheets

Related U.S. Application Data

(60) Provisional application No. 62/355,611, filed on Jun. 28, 2016.

(51) Int. Cl.
*H01L 21/02* (2006.01)
*C23C 16/06* (2006.01)
*C23C 16/02* (2006.01)
*C23C 16/40* (2006.01)
*C23C 16/505* (2006.01)
*C23C 28/00* (2006.01)
*H01L 21/3205* (2006.01)
*H01L 21/768* (2006.01)
*H10B 43/27* (2023.01)

(52) U.S. Cl.
CPC .......... *C23C 16/402* (2013.01); *C23C 16/505* (2013.01); *C23C 28/322* (2013.01); *C23C 28/34* (2013.01); *C23C 28/345* (2013.01); *C23C 28/42* (2013.01); *H01L 21/0245* (2013.01); *H01L 21/02164* (2013.01); *H01L 21/02274* (2013.01); *H01L 21/02304* (2013.01); *H01L 21/02315* (2013.01); *H01L 21/02458* (2013.01); *H01L 21/02491* (2013.01); *H01L 21/02697* (2013.01); *H01L 21/28556* (2013.01); *H01L 21/28568* (2013.01); *H01L 21/32051* (2013.01); *H01L 21/76876* (2013.01); *H10B 43/27* (2023.02)

(56) References Cited

U.S. PATENT DOCUMENTS

| | | |
|---|---|---|
| 2009/0087585 A1 | 4/2009 | Lee et al. |
| 2009/0232985 A1 | 9/2009 | Dussarat et al. |
| 2010/0173501 A1 | 7/2010 | Miya et al. |
| 2011/0130011 A1 | 6/2011 | Sasajima et al. |
| 2011/0180413 A1 | 7/2011 | Whitaker et al. |
| 2012/0164327 A1 | 6/2012 | Sato et al. |
| 2013/0017689 A1* | 1/2013 | Khan ................ H01L 21/28264 438/770 |
| 2014/0199839 A1 | 7/2014 | Sato et al. |
| 2015/0087161 A1* | 3/2015 | Sato ................. H01L 21/02164 438/787 |
| 2015/0206757 A1 | 7/2015 | Han et al. |
| 2017/0278864 A1 | 9/2017 | Hu et al. |
| 2020/0350014 A1 | 11/2020 | Liu |
| 2021/0249436 A1 | 8/2021 | Ding et al. |

FOREIGN PATENT DOCUMENTS

| | | | |
|---|---|---|---|
| JP | 2000122087 A | 4/2000 | |
| JP | 2007-129119 A | 5/2007 | |
| JP | 2008-533731 A | 8/2008 | |
| JP | 2010147267 A | 7/2010 | |
| JP | 4595702 B2 | 12/2010 | |
| JP | 5813303 B2 | 11/2015 | |
| KR | 20030057641 A | 7/2003 | |
| KR | 10-2006-0050163 A | 5/2006 | |
| KR | 2013062256 A * | 6/2013 | ........... C23C 16/045 |

OTHER PUBLICATIONS

Office Action for Korean Application No. 10-2019-7002646 dated Mar. 11, 2020.
Korean Office Action dated May 12, 2021 for Application No. 10-2021-7001781.
Office Action for Chinese Application No. 201780040172.3 dated Oct. 20, 2022.
Search Report for Chinese Application No. 201780040172.3 dated Oct. 14, 2022.

* cited by examiner

CVD BASED OXIDE-METAL MULTI STRUCTURE FOR 3D NAND MEMORY DEVICES

CROSS-REFERENCE TO RELATED APPLICATIONS

This application is a divisional application of co-pending U.S. patent application Ser. No. 15/633,366, filed on Jun. 26, 2017, which claims benefit of U.S. Provisional Patent Application Ser. No. 62/355,611, filed on Jun. 28, 2016. Each of afore mentioned patent applications are incorporated herein by reference.

BACKGROUND

Field

Implementations described herein generally relate to a method for forming a metal layer and to a method for forming an oxide layer on the metal layer. Implementations described herein also relate to a method for forming an oxide-metal multilayer structure.

Description of the Related Art

Designers of computer memory devices are ever in pursuit of smaller geometries with increased capacity at less cost. To this end, components of memory cells are now stacked on top of each other to create three dimensional (3D) cells. One such technology is NAND flash memory, which may be found in memory cards, USB flash drives, solid-state drives and similar products, for data storage and transfer. In NAND flash memory, memory cells made from transistors are connected in series, and can be stacked into vertical layers to create densely packed, high capacity devices. With no moving parts, flash drives use less power and are more durable than ordinary hard drives. Accordingly, there is great interest in increasing the capacity of flash drives, while reducing their size and cost.

To create 3D structures for memory cells, charge trapping transistors may be stacked into vertical layers. The vertical layers may be alternating oxide and metal layers. However, the metal layer deposited by chemical vapor deposition (CVD) process is known to have large grain size, high surface roughness, and high tensile stress and is prone to oxidation during the subsequent oxide deposition process.

Therefore, an improved method of forming a metal layer is needed.

SUMMARY

Implementations described herein generally relate to a method for forming a metal layer and to a method for forming an oxide layer on the metal layer. Implementations described herein also relate to a method for forming an oxide-metal multilayer structure. In one implementation, a method includes placing a substrate into a processing chamber and forming a metal-containing layer on the substrate. The forming a metal-containing layer on the substrate includes increasing a temperature of the substrate to a processing temperature, flowing a metal-containing precursor and nitrogen gas into the processing chamber, wherein a ratio of a flow rate of the metal-containing precursor to a flow rate of the nitrogen gas ranges from 10:1 to 1:3, and forming a plasma inside of the processing chamber by igniting the metal-containing precursor and nitrogen gas with a high frequency radio frequency power and a low frequency radio frequency power.

In another implementation, a method includes placing a substrate into a processing chamber, forming a metal layer on the substrate, treating a surface of the metal layer with a nitrogen-containing plasma, and forming an oxide layer on the treated surface of the metal layer.

In another implementation, a method includes placing a substrate into a processing chamber, forming a metal layer on the substrate, and forming an oxide layer on the metal layer. The forming an oxide layer includes flowing an oxygen-free precursor into the processing chamber, wherein the oxygen-free precursor is excited by a plasma to form oxygen-free species, flowing an oxygen-containing gas into the processing chamber, wherein the oxygen-containing gas is excited by the plasma to form oxygen species, and bonding the oxygen-free species to the oxygen species.

BRIEF DESCRIPTION OF THE DRAWINGS

So that the manner in which the above recited features of the present disclosure can be understood in detail, a more particular description of the disclosure, briefly summarized above, may be had by reference to implementations, some of which are illustrated in the appended drawings. It is to be noted, however, that the appended drawings illustrate only selected implementations of this disclosure and are therefore not to be considered limiting of its scope, for the disclosure may admit to other equally effective implementations.

FIG. 5 is a chart illustrating effects of co-flowing nitrogen gas with metal-containing precursor during formation of the metal layer according to implementations disclosed herein.

To facilitate understanding, identical reference numerals have been used, wherever possible, to designate identical elements that are common to the Figures. Additionally, elements of one implementation may be advantageously adapted for utilization in other implementations described herein.

DETAILED DESCRIPTION

Implementations described herein generally relate to a method for forming a metal layer and to a method for forming an oxide layer on the metal layer. In one implementation, the metal layer is formed on a seed layer, and the seed layer helps the metal in the metal layer nucleate with small grain size without affecting the conductivity of the metal layer. The metal layer may be formed using plasma enhanced chemical vapor deposition (PECVD) and nitrogen gas may be flowed into the processing chamber along with the precursor gases. In another implementation, a barrier layer is formed on the metal layer in order to prevent the metal layer from being oxidized during subsequent oxide layer deposition process. In another implementation, the metal layer is treated prior to the deposition of the oxide layer in order to prevent the metal layer from being oxidized.

Figure 1A:
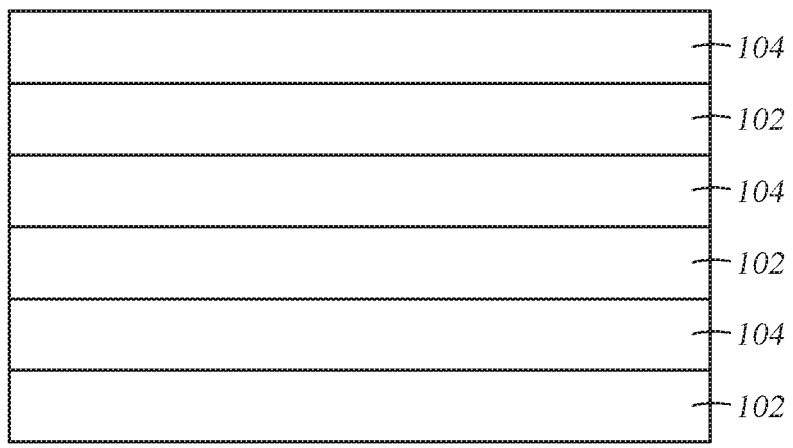
FIGS. 1A-1C are schematic cross sectional views of a multilayer structure according to implementations disclosed herein.
Figure 1B:
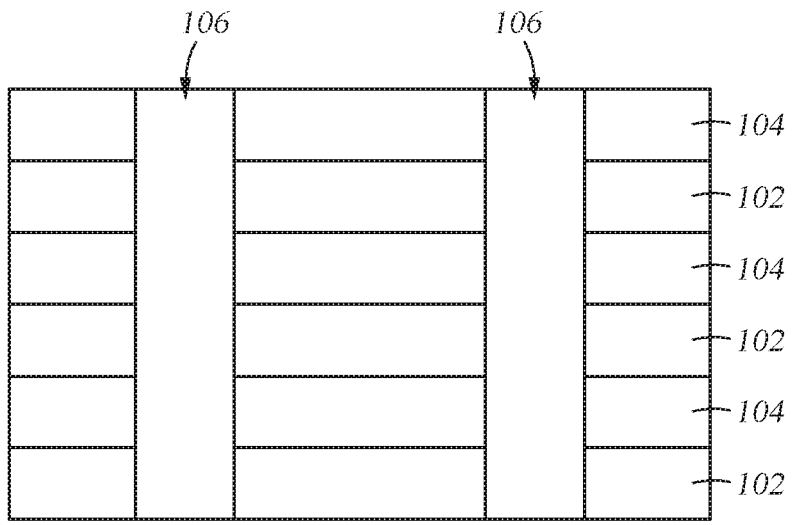
Figure 1C:
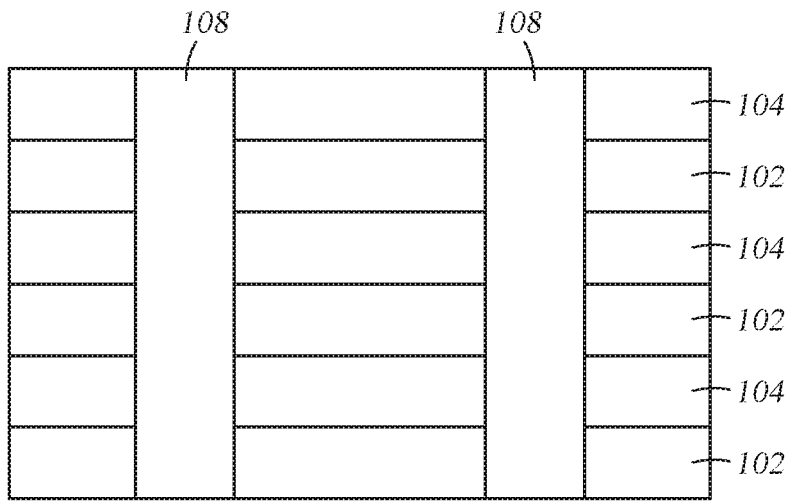

FIGS. 1A-1C are schematic cross sectional views of a multilayer structure 100 according to implementations disclosed herein. As shown in FIG. 1A, the multilayer structure 100 includes alternating metal and oxide layers 102, 104. The oxide layer 104 may be silicon oxide or any other suitable oxide layer. The metal layer 102 may be tungsten or any other suitable metal layer. The metal layer 102 may include one or more of the following elements: cobalt, molybdenum, tungsten, tantalum, titanium, ruthenium, rhodium, copper, iron, manganese, vanadium, niobium, hafnium, zirconium, yttrium, aluminum, tin, chromium, or lanthanum. In this illustrative example, a first or bottom metal layer 102 is deposited, followed by an oxide layer 104, then another metal layer 102, followed by another oxide layer 104, followed by another metal layer 102, and then another oxide layer 104. It should be understood that additional layers will also be provided in practice. In one implementation, the multilayer structure 100 includes 100 layers of alternating metal and oxide layers 102, 104. Further, the bottom layer may be an oxide layer 104 (not shown). Alternatively, the bottom layer may be a metal layer 102, as shown in FIG. 1A.

Next, a plurality of channels 106 (two are shown) are formed in the multilayer structure 100, as shown in FIG. 1B. The plurality of channels 106 may be formed by any suitable method, such as dry etching. Next, a material 108 is deposited in each of the plurality of channels 106, as shown in FIG. 1C. The material 108 may be any suitable material, such as polysilicon.

Conventionally, the metal layer is deposited on the oxide layer using CVD, and the CVD based metal layer is known to have large grain size, high surface roughness, high tensile stress and is prone to oxidation during the subsequent oxide deposition process. One method of reducing grain size in the metal layer is to deposit the metal layer on a seed layer.

Figure 2A:
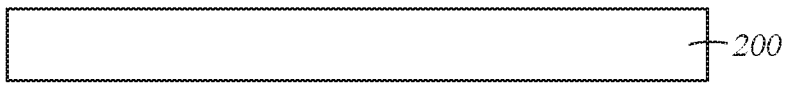
FIGS. 2A-2C schematically illustrate formation of a seed layer and a metal layer on the seed layer according to implementations disclosed herein.
Figure 2B:
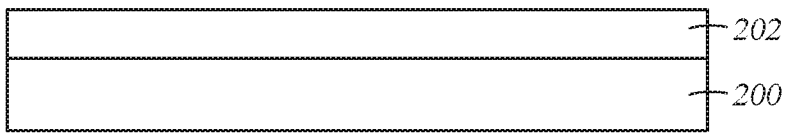
Figure 2C:
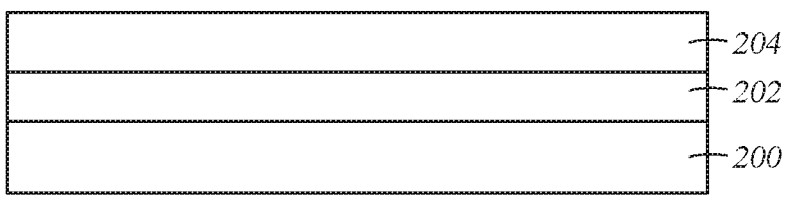

FIGS. 2A-2C schematically illustrate formation of a seed layer 202 and a metal layer 204 on the seed layer 202 according to implementations disclosed herein. FIG. 2A is a schematic cross sectional view of a substrate 200. The substrate 200 may be any suitable substrate and may include one or more layers already formed thereon. Next, as shown in FIG. 2B, a seed layer 202 is formed on the substrate 200. The seed layer 202 may be titanium nitride, molybdenum nitride, tungsten nitride, amorphous boron, or amorphous silicon. In one implementation, the seed layer 202 is an amorphous boron layer. The seed layer 202 may be deposited by any suitable method, such as CVD or PECVD.

Next, as shown in FIG. 2C, a metal layer 204 is deposited on the seed layer 202. The metal layer 204 may be the metal layer 102 shown in FIG. 1A. The metal layer 204 may be a metal layer in a suitable electronic device. In one implementation, the metal layer 204 is tungsten. The seed layer 202 nucleates the metal layer 204 with the smallest grain size without affecting the conductivity of the metal layer 204. The seed layer 202 also serves as an adhesion layer for the adhesion of the metal layer 204 to the substrate 200 or to an oxide layer, such as the oxide layer 104 shown in FIG. 1A. In one implementation, the metal layer 204 has a thickness of about 200 Angstroms and has an electrical resistivity of less than about 30 µohm*cm. Each metal layer 102 shown in FIG. 1A may be deposited on a seed layer, such as the seed layer 202. In order to further reduce the grain size of the metal layer 204, the metal layer 204 is deposited using methods shown in FIGS. 3 and 4. In some implementations, the metal layer 102 or the metal layer 204 is a metal-containing layer, which may be metal nitrides, metal silicides, or metal silicon nitrides. In one implementation, the metal layer 102 or the metal layer 204 is titanium nitride or tungsten nitride.

Figure 3:
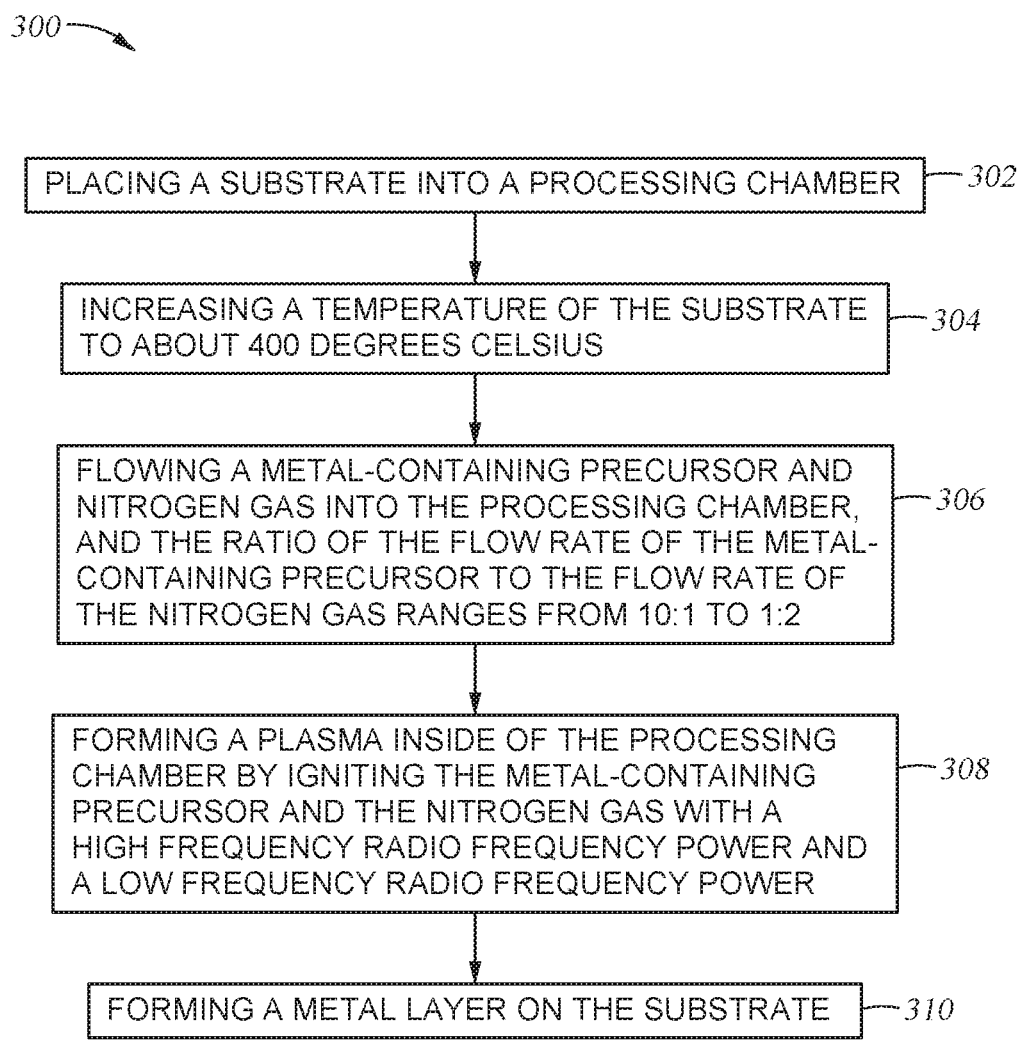
FIG. 3 illustrates a process for forming the metal layer according to one implementation disclosed herein.

FIG. 3 illustrate a process 300 for forming the metal layer according to implementations disclosed herein. The process 300 starts at block 302, which is placing a substrate into a processing chamber. The substrate may be the substrate 200 shown in FIG. 2A. The processing chamber may be any suitable processing chamber, such as a PECVD processing chamber. The substrate is heated to a processing temperature of about 350 degrees Celsius to about 450 degrees Celsius, such as about 400 degrees Celsius, as shown at block 304. The substrate may be heated by any suitable heating method, such as by heating elements embedded in a substrate support that is used to support the substrate inside the processing chamber. Next, at block 306, a metal-containing precursor and nitrogen gas ($N_2$) are introduced into the processing chamber. Additional gases such as hydrogen and/or argon gases may be flowed into the processing chamber along with the metal precursor and the nitrogen gas. The metal-containing precursor may be any suitable metal-containing precursor, such as tungsten hexafluoride. The flow rate of the nitrogen gas is controlled so the metal layer formed on the substrate is pure metal (99.9%) and is not a metal nitride. The ratio of the flow rate of the metal-containing precursor to the flow rate of the nitrogen gas ranges from about 10:1 to about 1:2. In one implementation, the ratio of the flow rate of the metal-containing precursor to the flow rate of the nitrogen gas is about 3:1.

Next, at block 308, a plasma is formed inside of the processing chamber by igniting the metal-containing precursor and the nitrogen gas with a high frequency radio frequency (HFRF) power and a low frequency radio frequency (LFRF) power. The HFRF power may have a frequency of about 13.56 MHz and a power density of about 0.707 W/cm$^2$. The LFRF power may have a frequency ranging from about 200 kHz to about 500 kHz, such as about 350 kHz and a power density ranging from about 0.071 W/cm$^2$ to about 0.283 W/cm$^2$. Next, at block 310, a metal layer is formed on the substrate. The metal layer may be the metal layer 102 shown in FIG. 1A or the metal layer 204 shown in FIG. 2C. The metal layer may be any suitable metal, such as tungsten. The combination of having a seed layer, such as the seed layer 202 shown in FIG. 2C, forming the metal layer using PECVD, co-flowing nitrogen gas along with the metal-containing precursor at a specific ratio range, and using both HFRF power and LFRF power to form the plasma lead to the metal layer having a smooth surface, the smallest grain size and lowest electrical resistivity. The metal layer has an electrical resistivity that is less than about 30 µohm*cm, and the surface roughness of the metal layer is less than about 1 nm. The addition of nitrogen gas in the process of forming the metal layer does not lead to a metal nitride layer. The nitrogen radicals and/or ions in the metal layer are not chemically bonded to the metal, and the nitrogen radicals and/or ions are acting more like a dopant in the metal layer, which helps reducing the grain size of the metal layer. In addition, the nitrogen flow rate may be adjusted to control the stress of the metal layer.

Figure 4:
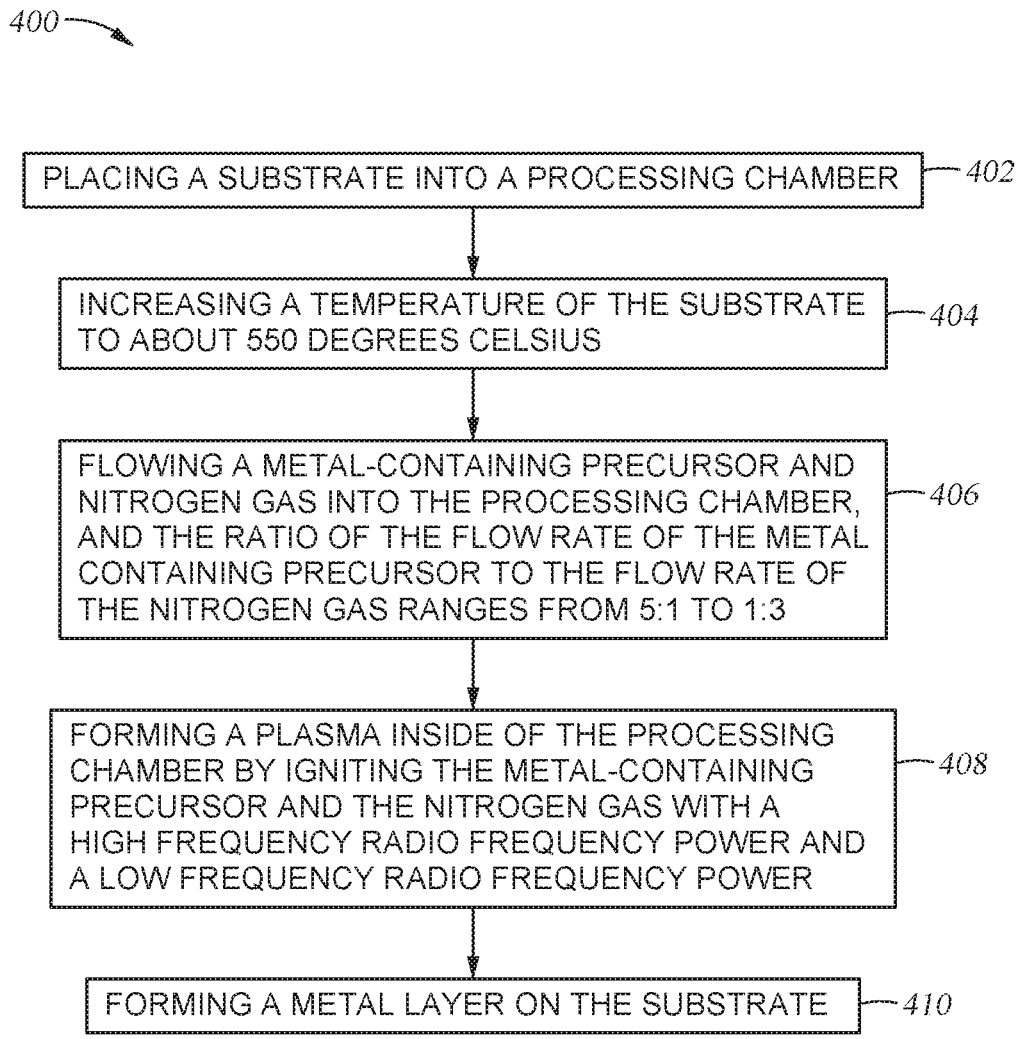
FIG. 4 illustrates a process for forming the metal layer according to another implementation disclosed herein.

FIG. 4 illustrate a process 400 for forming the metal layer according to implementations disclosed herein. The process 400 starts at block 402, which is placing a substrate into a processing chamber. The substrate may be the substrate 200 shown in FIG. 2A. The processing chamber may be any suitable processing chamber, such as a PECVD processing chamber. The substrate is heated to a processing temperature of about 500 degrees Celsius to about 600 degrees Celsius, such as about 550 degrees Celsius, as shown at block 404. The substrate may be heated by any suitable heating method, such as by heating elements embedded in a substrate support that is used to support the substrate inside the processing chamber. The benefit of heating the substrate to about 550 degrees Celsius is that the subsequent layer, such as an oxide layer, formed on the metal layer may be deposited at about 550 degrees Celsius. Thus, the time used for heating of the substrate from about 400 degrees Celsius to about 550 degrees Celsius between depositing the metal layer and depositing the oxide layer can be omitted.

Next, at block 406, a metal-containing precursor and nitrogen gas ($N_2$) are introduced into the processing chamber. Additional gases such as hydrogen and/or argon gases may be flowed into the processing chamber along with the metal precursor and the nitrogen gas. The metal-containing precursor may be any suitable metal-containing precursor, such as tungsten hexafluoride. The flow rate of the nitrogen gas is controlled so the metal layer formed on the substrate is pure metal (99.9%) and is not a metal nitride. At a higher temperature, such as about 550 degrees Celsius, a higher flow rate of the nitrogen gas is utilized compared to depositing the metal layer at a lower temperature, such as about 400 degrees Celsius. The ratio of the flow rate of the metal-containing precursor to the flow rate of the nitrogen gas ranges from about 5:1 to about 1:3. In one implementation, the ratio of the flow rate of the metal-containing precursor to the flow rate of the nitrogen gas is about 2:1.

Next, at block 408, a plasma is formed inside of the processing chamber by igniting the metal-containing precursor and the nitrogen gas with a high frequency radio frequency (HFRF) power and a low frequency radio frequency (LFRF) power. The HFRF power may have a frequency of about 13.56 MHz and a power density of about 0.707 $W/cm^2$. The LFRF power may have a frequency ranging from about 200 kHz to about 500 kHz, such as about 350 kHz and a power density ranging from about 0.071 $W/cm^2$ to about 0.566 $W/cm^2$. Next, at block 410, a metal layer is formed on the substrate. The metal layer may be the metal layer 102 shown in FIG. 1A or the metal layer 204 shown in FIG. 2C. The metal layer may be any suitable metal, such as tungsten. The combination of having a seed layer, such as the seed layer 202 shown in FIG. 2C, forming the metal layer using PECVD, co-flowing nitrogen gas along with the metal-containing precursor at a specific ratio range, and using both HFRF power and LFRF power to form the plasma lead to the metal layer having a smooth surface, the smallest grain size and lowest electrical resistivity. The metal layer has an electrical resistivity that is less than about 30 μohm*cm, and the surface roughness of the metal layer is less than about 1 nm. The addition of nitrogen gas in the process of forming the metal layer does not lead to a metal nitride layer. The nitrogen radicals and/or ions in the metal layer are not chemically bonded to the metal, and the nitrogen radicals and/or ions are acting more like a dopant in the metal layer, which helps reducing the grain size of the metal layer. In addition, the nitrogen flow rate may be adjusted to control the stress of the metal layer. The effects of co-flowing the nitrogen gas with metal-containing precursor during formation of the metal layer on the stress and electrical resistivity of the metal layer are shown in FIG. 5.

Figure 5:
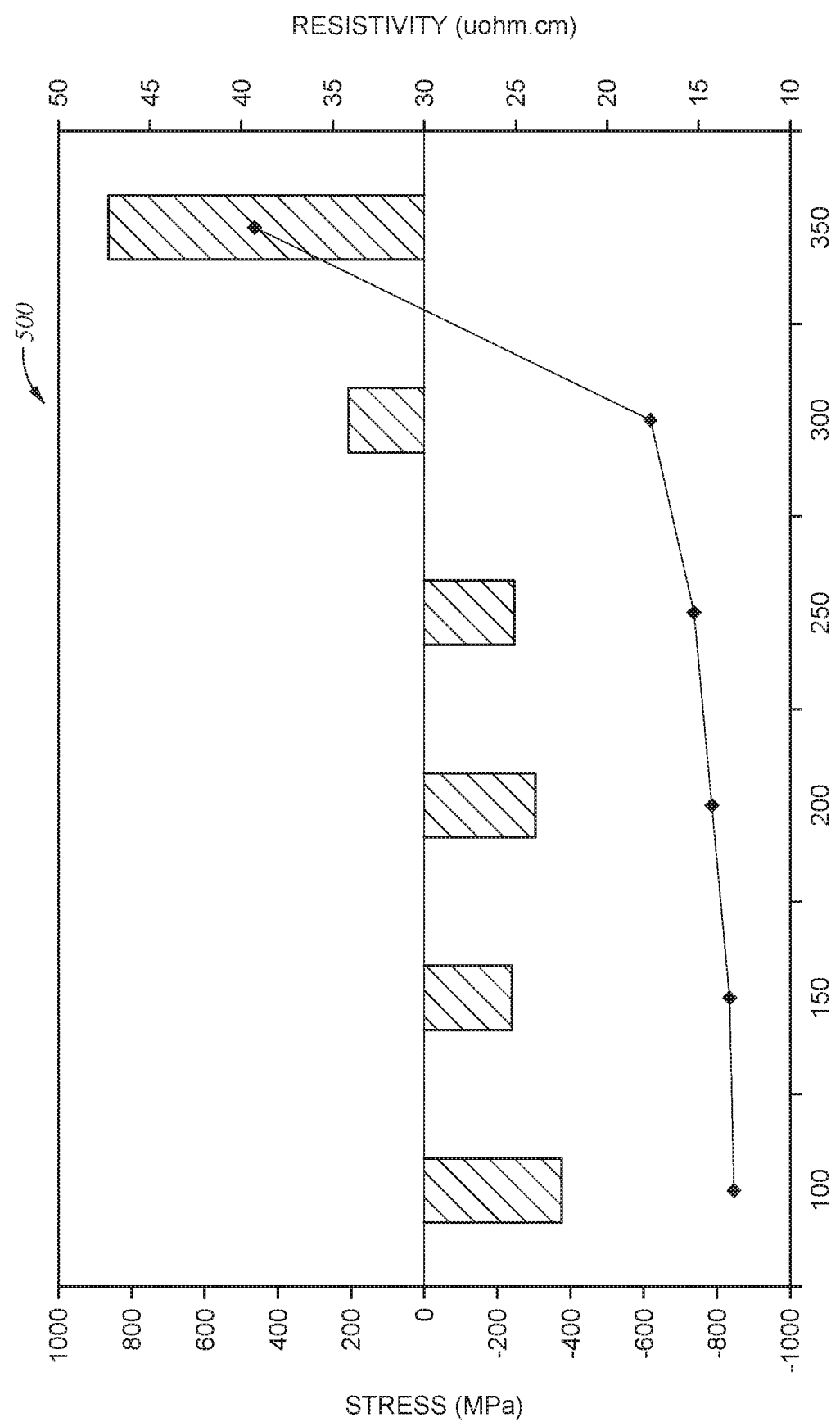
FIG. 5 is a chart illustrates effects of co-flowing nitrogen gas with metal-containing precursor during formation of the metal layer according to implementations disclosed herein.

FIG. 5 is a chart 500 illustrating effects of co-flowing nitrogen gas with metal-containing precursor during formation of the metal layer according to implementations disclosed herein. As shown in FIG. 5, the nitrogen flow rate ranges from 100 standard cubic centimeters per minute (sccm) to 500 sccm, the stress of the metal layer ranges from compressive (negative values) to tensile (positive values), and the electrical resistivity of the metal layer ranges from about 14 μohm*cm to about 39 μohm*cm. When the nitrogen flow rate is between 100 sccm and 300 sccm, the electrical resistivity of the metal layer is less than 20 μohm*cm, and the stress of the metal layer can be tuned between about −400 MPa and about 200 MPa.

Figure 6A:
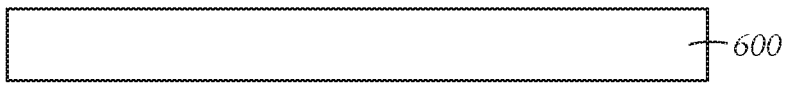
Figure 6B:
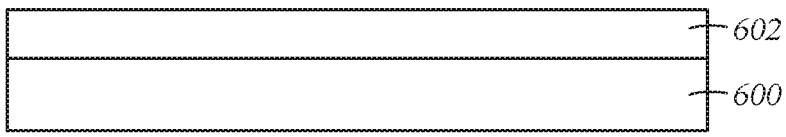
Figure 6C:
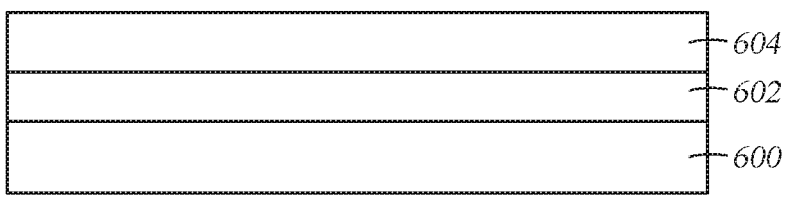

FIGS. 6A-6C schematically illustrate formation of a barrier layer 602 on a metal layer 600 and an oxide layer 604 on the barrier layer 602 according to implementations disclosed herein. As shown in FIG. 6A, the metal layer 600 may be the metal layer 102 shown in FIG. 1A or the metal layer 204 shown in FIG. 2C. The metal layer 600 may be a metal layer in any suitable electronic device. In one implementation, the metal layer 600 is tungsten and has a thickness ranging from about 100 Angstroms to about 300 Angstroms.

Next, as shown in FIG. 6B, the barrier layer 602 is deposited on the metal layer 600. The barrier layer 602 may be an oxide, such as a metal oxide, or a high k oxide. The barrier layer 602 may be a nitride, such as a metal nitride or any transition metal nitride. In one implementation, the barrier layer 602 is titanium nitride. In another implementation, the barrier layer 602 is silicon nitride. The barrier layer 602 may be deposited by any suitable method, such as atomic layer deposition (ALD), CVD, or PECVD. The barrier layer 602 may have a thickness ranging from about 5 Angstroms to about 100 Angstroms, such as from about 20 Angstroms to about 70 Angstroms, for example about 50 Angstroms.

Next, as shown in FIG. 6C, the oxide layer 604 is deposited on the barrier layer 602. The oxide layer 604 may be the oxide layer 104 shown in FIG. 1C. Due to the barrier layer 602 formed between the metal layer 600 and the oxide layer 604, the metal layer 600 is not oxidized by the oxide layer 604 formed on the barrier layer 602.

Figure 7:
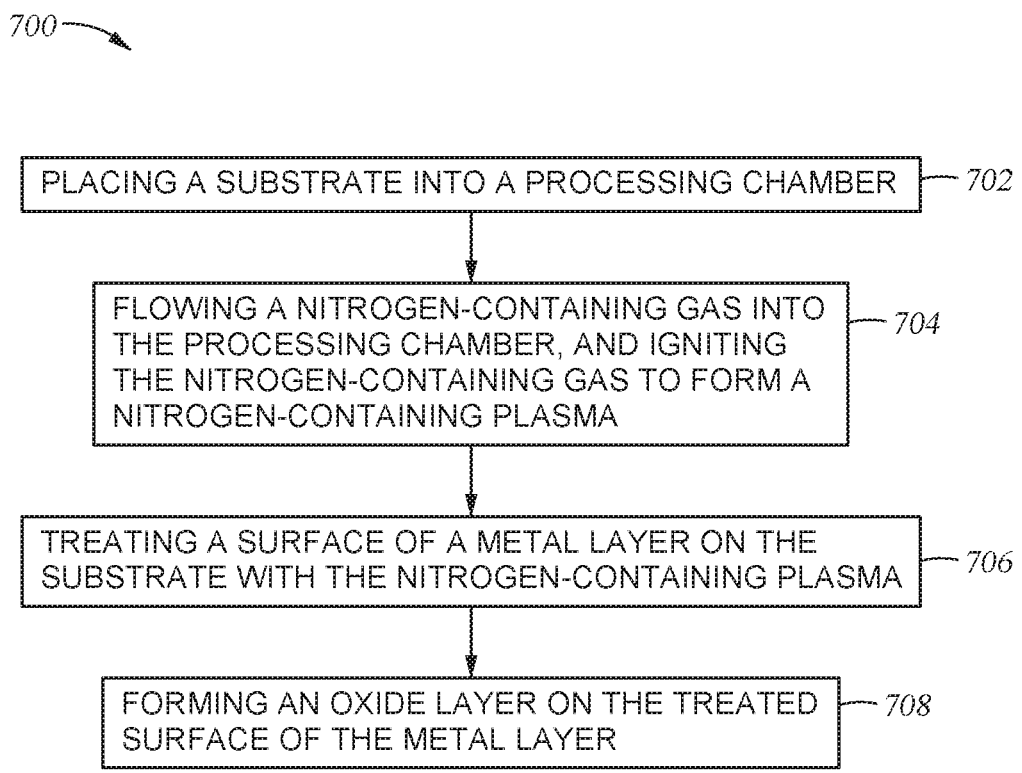
FIG. 7 illustrates a process for treating a surface of the metal layer according to one implementation disclosed herein.

In another implementation, oxidization of the metal layer is avoided without forming a barrier layer between the metal layer and the oxide layer. FIG. 7 illustrates a process 700 for treating a surface of the metal layer according to one implementation disclosed herein. The process 700 starts at block 702, which is placing a substrate into a processing chamber. The substrate may be the substrate 200 shown in FIG. 2A. A metal layer, such as the metal layer 102 shown in FIG. 1C or the metal layer 204 shown in FIG. 2C, may be deposited on the substrate in the processing chamber or in a different chamber. The processing chamber may be any suitable processing chamber, such as a PECVD processing chamber. Next, at block 704, a nitrogen-containing gas is flowed into the processing chamber, and the nitrogen-containing gas is ignited to form a nitrogen-containing plasma. The nitrogen-containing gas may be any suitable nitrogen-containing gas, such as nitrogen gas or ammonia.

The surface of the metal layer is treated by the nitrogen-containing plasma, as shown at block 706. The nitrogen-containing plasma includes nitrogen species, such as nitrogen radicals or ions, and the nitrogen species may be bonded to the metal on the surface of the metal layer, converting the surface of the metal layer to metal nitride. The power used to ignite the nitrogen-containing gas and the time the surface is treated by the nitrogen-containing plasma are controlled so the surface of the metal layer is converted from metal to metal nitride, while no nitride layer is formed on the metal layer. In one implementation, the metal layer is tungsten, and the surface of the metal layer is tungsten nitride.

Next, at block 708, an oxide layer is formed on the treated surface of the metal layer. A purge process may be performed between the treating the surface of the metal layer and the forming the oxide layer on the treated surface of the metal layer. The oxide layer may be formed on the treated surface of the metal layer in the processing chamber or in a different chamber. The oxide layer may be the oxide layer 104 shown in FIG. 1C. Due to the treated surface of the metal layer, the metal layer is not oxidized by the oxide layer formed thereon.

In another implementation, the method for forming the oxide layer is modified in order to form the oxide layer on the metal layer without oxidizing the metal layer. In such implementation, oxidation of the metal layer is avoided without forming a barrier layer between the metal layer and the oxide layer or without treating the surface of the metal layer.

Figure 8:
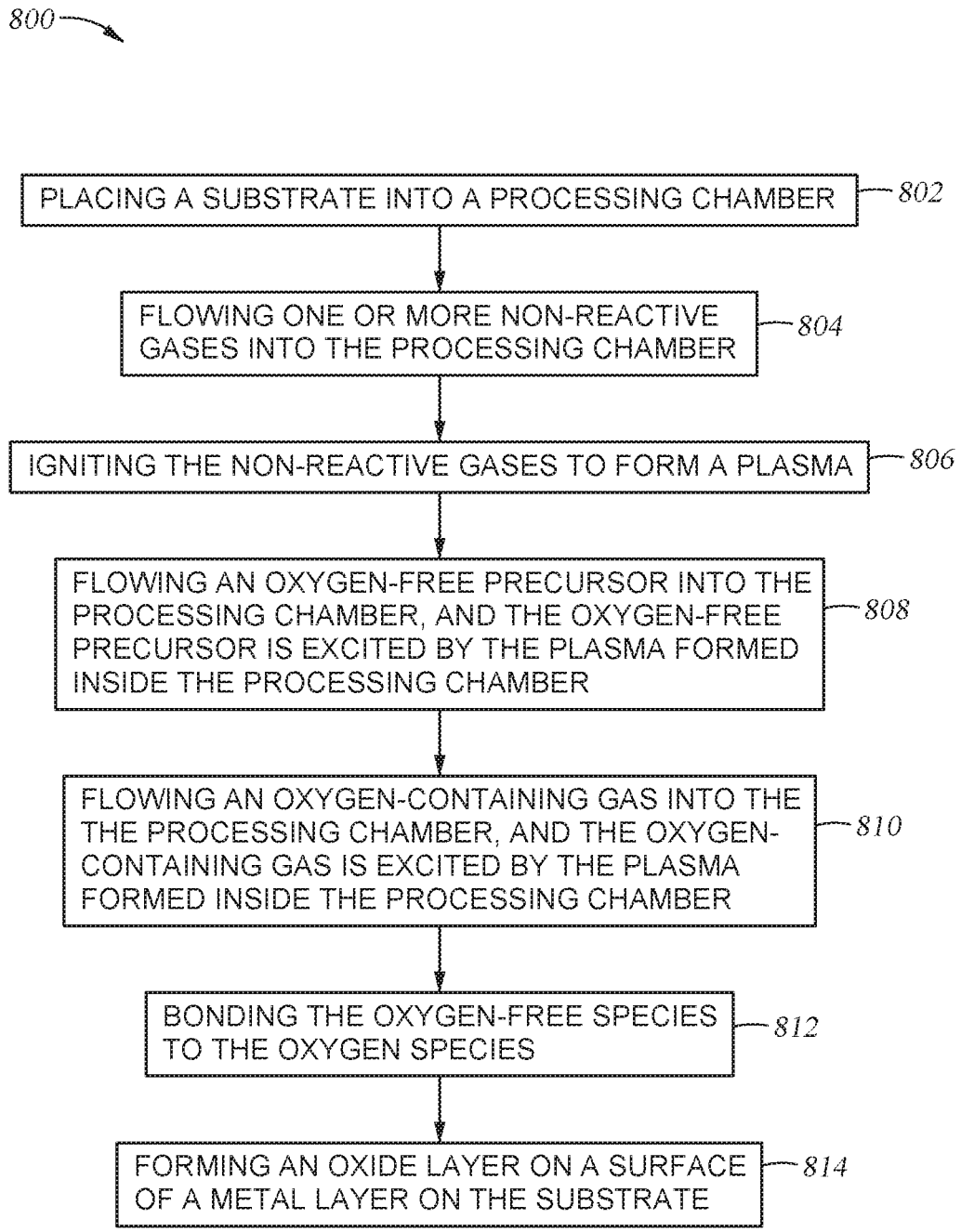
FIG. 8 illustrates a process for forming an oxide layer according to one implementation disclosed herein.

FIG. 8 illustrates a process 800 for forming an oxide layer according to one implementation disclosed herein. The process 800 starts at block 802, which is placing a substrate into a processing chamber. The substrate may be the substrate 200 shown in FIG. 2A. A metal layer, such as the metal layer 102 shown in FIG. 1C or the metal layer 204 shown in FIG. 2C, may be deposited on the substrate in the processing chamber or in a different chamber. The processing chamber may be any suitable processing chamber, such as a PECVD processing chamber. Next, at block 804, one or more non-reactive gases are flowed into the processing chamber. The one or more non-reactive gases may be any suitable gases, such as argon gas. Hydrogen gas may be also considered non-reactive. In one implementation, hydrogen gas and argon gas are flowed into the processing chamber. Next, at block 806, the one or more non-reactive gases are ignited to form a plasma. The plasma may be utilized to remove any native oxide formed on the metal layer. Next, at block 808, an oxygen-free precursor is flowed into the processing chamber, and the oxygen-free precursor is excited by the plasma formed in the processing chamber. The oxygen-free precursor may be any suitable oxygen-free precursor, such as a silicon-containing precursor, for example silane. The excitation of the oxygen-free precursor forms oxygen-free species, such as radicals or ions, and the oxygen-free species may be floating in the processing chamber between a showerhead and the surface of the metal layer. Some oxygen-free species may fall on the surface of the metal layer. In one implementation, a monolayer of amorphous silicon may be formed on the surface of the metal layer.

Next, at block 810, an oxygen-containing gas is flowed into the processing chamber, and the oxygen-containing gas is excited by the plasma formed inside the processing chamber. In one implementation, no purge process is performed between flowing the oxygen-free precursor into the processing chamber and flowing the oxygen-containing gas into the processing chamber. The oxygen-containing gas may be any suitable oxygen-containing gas, such as oxygen gas. The excitation of the oxygen-containing gas forms oxygen species, such as radicals or ions, and the oxygen species bond with oxygen-free species floating in the processing chamber and/or on the surface of the metal layer, as shown at block 812. Bonding of the oxygen species to the oxygen-free species forms an oxide layer on the surface of the metal layer on the substrate, as shown at block 814. The oxide layer may be any suitable oxide layer, such as silicon oxide layer. Because the oxygen-free precursor is flowed into the processing chamber prior to flowing the oxygen-containing gas into the processing chamber, the oxygen-containing gas or species are bonded to the oxygen-free precursor or species. Thus, the metal layer is not oxidized. The modified method for forming the oxide layer may be performed by PECVD, CVD, ALD, or physical vapor deposition (PVD). The plasma (oxygen-free precursor and/or oxygen-containing gas) may be formed in-situ or formed at a remote location, such as in a remote plasma source.

Figure 9A:
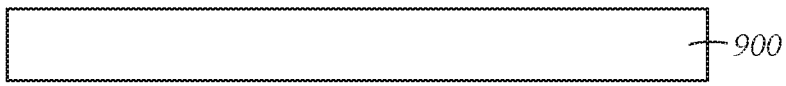
FIGS. 9A-9E schematically illustrate the formation of the multilayer structure shown in FIG. 1A according to implementations disclosed herein.
Figure 9B:

FIGS. 9A-9E schematically illustrate the formation of the multilayer structure 100 shown in FIG. 1A according to implementations disclosed herein. FIG. 9A is a schematic cross sectional view of a substrate 900. The substrate 900 may be any suitable substrate and may include one or more layers already formed thereon. Next, as shown in FIG. 9B, a seed layer 902 is formed on the substrate 900. The seed layer 902 may be titanium nitride, molybdenum nitride, tungsten nitride, amorphous boron, or amorphous silicon. In one implementation, the seed layer 902 is an amorphous boron layer. The seed layer 902 may be deposited by any suitable method, such as CVD or PECVD.

Figure 9C:

Next, as shown in FIG. 9C, a metal layer 904 is deposited on the seed layer 902. The metal layer 904 may be the metal layer 102 shown in FIG. 1A. In one implementation, the metal layer 904 is tungsten. The seed layer 902 nucleates the metal layer 904 with the smallest grain size without affecting the conductivity of the metal layer 904. The seed layer 902 also serves as an adhesion layer for the adhesion of the metal layer 904 to the substrate 900 or to an oxide layer, such as the oxide layer 104 shown in FIG. 1A. In one implementation, the metal layer 904 has a thickness of about 200 Angstroms and has an electrical resistivity of less than about 30 µohm*cm. In order to further reduce the grain size of the metal layer 904, the metal layer 904 is deposited using methods shown in FIGS. 3 and 4. The combination of having a seed layer, such as the seed layer 902, forming the metal layer 904 using PECVD, co-flowing nitrogen gas along with the metal-containing precursor at a specific ratio range, and using both HFRF power and LFRF power to form the plasma lead to the metal layer 904 having a smooth surface, the smallest grain size and lowest electrical resistivity.

Figure 9D:
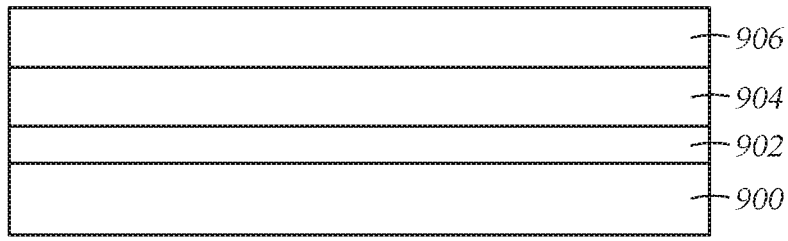

Next, an oxide layer 906 is deposited on the metal layer 904, as shown in FIG. 9D. Prior to the deposition of the oxide layer 906 on the metal layer 904, the surface of the metal layer 904 may be treated in order to prevent the oxidation of the metal layer 904 by the oxide layer 906. The treating of the surface of the metal layer 904 may include flowing a nitrogen-containing gas into the processing chamber, and igniting the nitrogen-containing gas to form a nitrogen-containing plasma. The nitrogen-containing gas may be any suitable nitrogen-containing gas, such as nitrogen gas or ammonia. The surface of the metal layer 904 is treated by the nitrogen-containing plasma. The nitrogen-containing plasma includes nitrogen species, such as nitrogen radicals or ions, and the nitrogen species may be bonded to the metal on the surface of the metal layer 904, converting the surface of the metal layer 904 to metal nitride. The power used to ignite the nitrogen-containing gas and the time the surface is treated by the nitrogen-containing plasma are controlled so the surface of the metal layer 904 is converted from metal to metal nitride, while no nitride layer is formed on the metal layer 904. In one implementation, the metal layer 904 is tungsten, and the surface of the metal layer is tungsten nitride.

Alternatively, a barrier layer (not shown) may be formed on the metal layer 904 prior to the deposition of the oxide layer 906 in order to prevent the oxidation of the metal layer 904 by the oxide layer 906. The barrier layer may be an oxide, such as a metal oxide, or a high k oxide. The barrier layer may be a nitride, such as a metal nitride or any transition metal nitride. In one implementation, the barrier layer is titanium nitride. In another implementation, the barrier layer is silicon nitride. The barrier layer may be deposited by any suitable method, such as atomic layer deposition (ALD), CVD, or PECVD. The barrier layer may have a thickness ranging from about 5 Angstroms to about 100 Angstroms, such as from about 20 Angstroms to about 70 Angstroms, for example about 50 Angstroms.

In another implementation, the oxide layer 906 is deposited on an untreated surface of the metal layer 904 without a barrier layer formed between the metal layer 904 and the oxide layer 906, and the metal layer 904 is not oxidized by the oxide layer 906. The oxide layer 906 may be formed by first flowing one or more non-reactive gases into the processing chamber. The one or more non-reactive gases may be any suitable gases, such as argon gas. Hydrogen gas may be also considered non-reactive. In one implementation, hydrogen gas and argon gas are flowed into the processing chamber. Next, the one or more non-reactive gases are ignited to form a plasma. The plasma may be utilized to remove any native oxide formed on the metal layer. Next, an oxygen-free precursor is flowed into the processing chamber, and the oxygen-free precursor is excited by the plasma formed in the processing chamber. The oxygen-free precursor may be any suitable oxygen-free precursor, such as a silicon-containing precursor, for example silane. The excitation of the oxygen-free precursor forms oxygen-free species, such as radicals or ions, and the oxygen-free species may be floating in the processing chamber between a showerhead and the surface of the metal layer. Some oxygen-free species may fall on the surface of the metal layer 904. In one implementation, a monolayer of amorphous silicon may be formed on the surface of the metal layer 904.

Next, an oxygen-containing gas is flowed into the processing chamber, and the oxygen-containing gas is excited by the plasma formed inside the processing chamber. In one implementation, no purge process is performed between flowing the oxygen-free precursor into the processing chamber and flowing the oxygen-containing gas into the processing chamber. The oxygen-containing gas may be any suitable oxygen-containing gas, such as oxygen gas. The excitation of the oxygen-containing gas forms oxygen species, such as radicals or ions, and the oxygen species bond with oxygen-free species floating in the processing chamber and/or on the surface of the metal layer 904. Bonding of the oxygen species to the oxygen-free species forms the oxide layer 906 on the surface of the metal layer on the substrate. Because the oxygen-free precursor is flowed into the processing chamber prior to flowing the oxygen-containing gas into the processing chamber, the oxygen-containing gas or species are bonded to the oxygen-free precursor or species. Thus, the metal layer 904 is not oxidized. The modified method for forming the oxide layer 906 without oxidizing the metal layer 904 may be performed by PECVD, CVD, ALD, or physical vapor deposition (PVD). The plasma (oxygen-free precursor and/or oxygen-containing gas) may be formed in-situ or formed at a remote location, such as in a remote plasma source.

Figure 9E:
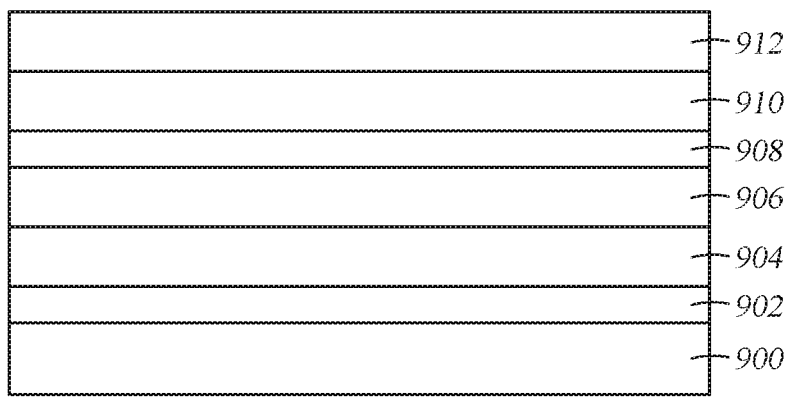

Next, as shown in FIG. 9E, another seed layer 908 is formed on the oxide layer 906, and the seed layer 908 may be the same as the seed layer 902. Another metal layer 910 is formed on the seed layer 908, and the metal layer 910 may be the same as the metal layer 904. The metal layer 910 may be formed by the same method for forming the metal layer 904. Another oxide layer 912 is formed on the metal layer 910, and the oxide layer 912 may be the same as the oxide layer 906. The oxide layer 912 may be formed by the same method for forming the oxide layer 906. By repeating the processes shown in FIGS. 9A-9E, the multilayered structure including multiple pairs of alternating oxide layers and metal layers can be formed.

While the foregoing is directed to implementations of the present disclosure, other and further implementations of the disclosure may be devised without departing from the basic scope thereof, and the scope thereof is determined by the claims that follow.

The invention claimed is:

1. A method, comprising:
   placing a substrate into a processing chamber;
   forming a metal layer on a seed layer formed on the substrate, comprising:
   increasing a temperature of the substrate to a processing temperature;
   flowing a metal-containing precursor and nitrogen gas into the processing chamber, wherein a ratio of a flow rate of the metal-containing precursor to a flow rate of the nitrogen gas ranges from 10:1 to 1:2; and
   forming a plasma inside of the processing chamber by igniting the metal-containing precursor and the nitrogen gas with a high frequency radio frequency power and a low frequency radio frequency power; and
   forming an oxide layer on a surface of the metal layer disposed on the substrate, forming the oxide layer comprising:
   flowing an oxygen-free precursor into the processing chamber, the oxygen-free precursor being excited by a plasma to form an oxygen-free species;
   flowing an oxygen-containing gas into the processing chamber subsequent to forming the oxygen-free species while continuing to flow the oxygen-free precursor into the processing chamber, the oxygen-containing gas being excited by the plasma to form an oxygen species; and
   bonding the oxygen-free species to the oxygen species during forming of the oxygen species.

2. The method of claim 1, further comprising flowing one or more non-reactive gases into the processing chamber prior to flowing the oxygen-free precursor into the processing chamber.

3. The method of claim 2, wherein the one or more non-reactive gases comprises argon or hydrogen gas.

4. The method of claim 1, wherein the oxygen-free precursor is a silicon-containing precursor.

5. The method of claim 4, wherein the oxygen-free precursor is silane.

6. The method of claim 1, wherein the oxygen-containing gas is oxygen gas.

7. The method of claim 1, wherein the metal layer is tungsten.

8. The method of claim 1, wherein the oxide layer is silicon oxide.

9. A method, comprising:
   placing a substrate into a first processing chamber;
   forming a metal layer on a seed layer formed on the substrate, comprising:

increasing a temperature of the substrate to a processing temperature;

flowing a metal-containing precursor and nitrogen gas into the first processing chamber, wherein a ratio of a flow rate of the metal-containing precursor to a flow rate of the nitrogen gas ranges from 10:1 to 1:2; and forming a plasma inside of the first processing chamber by igniting the metal-containing precursor and the nitrogen gas with a high frequency radio frequency power and a low frequency radio frequency power; and placing the substrate into a second processing chamber;

igniting non-reactive gases to form a plasma in the second processing chamber; and forming an oxide layer on a surface of the metal layer disposed on the substrate, forming the oxide layer comprising:

flowing an oxygen-free precursor into the second processing chamber, the oxygen-free precursor being excited by the plasma to form an oxygen-free species;

forming a monolayer of the oxygen-free species on the metal layer; then flowing an oxygen-containing gas into the second processing chamber while continuing to flow the oxygen-free precursor into the second processing chamber, the oxygen-containing gas being excited by the plasma to form an oxygen species in the second processing chamber; and then bonding the oxygen-free species to the oxygen species.

10. The method of claim 9, wherein the oxide layer comprises silicon oxide.

11. The method of claim 10, wherein the metal layer comprises tungsten.

12. The method of claim 11, wherein the monolayer of the oxygen-free species comprises a monolayer of amorphous silicon.

13. The method of claim 12, wherein the oxygen species comprise oxygen radicals or ions.

14. A method, comprising:

placing a substrate into a first processing chamber;

forming a metal layer on a seed layer formed on the substrate, wherein forming the metal layer on the seed layer, comprises:

increasing a temperature of the substrate to a processing temperature;

flowing a metal-containing precursor and nitrogen gas into the first processing chamber, wherein a ratio of a flow rate of the metal-containing precursor to a flow rate of the nitrogen gas ranges from 10:1 to 1:2; and forming a plasma inside of the first processing chamber by igniting the metal-containing precursor and the nitrogen gas with a high frequency radio frequency power and a low frequency radio frequency power;

placing the substrate into a second processing chamber;

removing a native oxide from the metal layer; and forming an oxide layer on the metal layer, wherein forming the oxide layer comprises:

flowing an oxygen-free precursor into the second processing chamber, wherein the oxygen-free precursor is excited by a plasma to form an oxygen-free species;

flowing an oxygen-containing gas into the second processing chamber subsequent to forming the oxygen-free species while continuing to flow the oxygen-free precursor into the second processing chamber, wherein the oxygen-containing gas is excited by the plasma to form an oxygen species; and bonding the oxygen-free species to the oxygen species during forming of the oxygen species.

15. The method of claim 14, wherein removing the native oxide from the metal layer comprises flowing one or more non-reactive gases into the second processing chamber.

16. The method of claim 15, wherein the one or more non-reactive gases comprises argon or hydrogen gas.

17. The method of claim 14, wherein the oxygen-free precursor is a silicon-containing precursor.

18. The method of claim 17, wherein the oxygen-free precursor is silane.

19. The method of claim 17, wherein the oxygen-containing gas is oxygen gas.

20. The method of claim 19, wherein the metal layer is tungsten.

* * * * *